(12) United States Patent
Little et al.

(10) Patent No.: US 7,920,461 B2
(45) Date of Patent: Apr. 5, 2011

(54) COMBINED ECHO AND CROSSTALK CANCELLATION

(75) Inventors: James M. Little, Sacramento, CA (US); Marwan Hassoun, Austin, TX (US); David Tetzlaff, Minnetonka, MN (US); Chang-Chi Liu, Fremont, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 119 days.

(21) Appl. No.: 12/286,063

(22) Filed: Sep. 25, 2008

(65) Prior Publication Data

US 2009/0196161 A1    Aug. 6, 2009

Related U.S. Application Data

(63) Continuation of application No. 12/012,908, filed on Feb. 5, 2008, now abandoned.

(60) Provisional application No. 60/900,180, filed on Feb. 7, 2007.

(51) Int. Cl.
*H04J 1/12* (2006.01)
*H04L 12/16* (2006.01)

(52) U.S. Cl. .................. 370/201; 370/252; 370/269

(58) Field of Classification Search .............. 370/201, 370/252, 269, 465
See application file for complete search history.

(56) References Cited

U.S. PATENT DOCUMENTS

| | | | |
|---|---|---|---|
| 2005/0105473 A1* | 5/2005 | Hausman et al. | 370/249 |
| 2005/0152463 A1* | 7/2005 | DeChamps et al. | 375/260 |
| 2005/0152468 A1* | 7/2005 | Lozhkin | 375/260 |
| 2005/0281188 A1* | 12/2005 | Cho et al. | 370/208 |
| 2006/0056551 A1* | 3/2006 | Lozhkin | 375/348 |
| 2006/0067447 A1* | 3/2006 | Lozhkin et al. | 375/349 |
| 2006/0146945 A1* | 7/2006 | Chow et al. | 375/260 |
| 2006/0268675 A1* | 11/2006 | Cho et al. | 370/210 |
| 2007/0076805 A1* | 4/2007 | Kalluri et al. | 375/260 |

\* cited by examiner

*Primary Examiner* — Andrew Lee
(74) *Attorney, Agent, or Firm* — Dorsey & Whitney LLP

(57) ABSTRACT

Combined echo and crosstalk cancellation is provided. Frequency domain adaptive filters are used to remove or reduce the effects of echo and crosstalk for a multi-channel and full-duplex communications system. Data from each transmit channel is buffered and converted to the frequency domain. The frequency domain data is multiplied by crosstalk coefficients to obtain a frequency domain correction signal for each channel. Adaptation of the crosstalk coefficients is based on correlations between the error signals and the data from each of the transmit channels. A single frequency domain transform engine, such as a Fast Fourier Transform engine, is employed for all calculations to save power and area.

26 Claims, 11 Drawing Sheets

| 512 POINT FFT | | 256 POINT FFT | |
|---|---|---|---|
| FFT_OP | DESCRIPTION | FFT_OP | DESCRIPTION |
| 00000 | SUBFRAME 0, POINT 0, ... | 10000 | SUBFRAME 0, POINT 0, ... |
| 00001 | SUBFRAME 1, POINT 8, ... | 10001 | SUBFRAME 1, POINT 1, ... |
| 00010 | SUBFRAME 2, POINT 2, ... | 10010 | SUBFRAME 2, POINT 2, ... |
| 00011 | SUBFRAME 3, POINT 14, ... | 10011 | SUBFRAME 3, POINT 3, ... |
| 00100 | SUBFRAME 4, POINT 4, ... | 10100 | SUBFRAME 4, POINT 4, ... |
| 00101 | SUBFRAME 5, POINT 12, ... | 10101 | SUBFRAME 5, POINT 5, ... |
| 00110 | SUBFRAME 6, POINT 6, ... | 10110 | SUBFRAME 6, POINT 6, ... |
| 00111 | SUBFRAME 7, POINT 10, ... | 10111 | SUBFRAME 7, POINT 7, ... |
| 01000 | SUBFRAME 8, POINT 1, ... | 11000 | NOT DEFINED |
| 01001 | SUBFRAME 9, POINT 15, ... | 11001 | NOT DEFINED |
| 01010 | SUBFRAME 10, POINT 3, ... | 11010 | NOT DEFINED |
| 01011 | SUBFRAME 11, POINT 13, ... | 11011 | NOT DEFINED |
| 01100 | SUBFRAME 12, POINT 5, ... | 11100 | NOT DEFINED |
| 01101 | SUBFRAME 13, POINT 11, ... | 11101 | NOT DEFINED |
| 01110 | SUBFRAME 14, POINT 7, ... | 11110 | NOT DEFINED |
| 01111 | SUBFRAME 15, POINT 9, ... | 11111 | NOT DEFINED |

| FFT1_OP | CODE |
|---|---|
| NORMAL | 000 |
| NORMALFIRST | 001 |
| NORMALLAST | 010 |
| ERROR | 100 |
| ERRORFIRST | 101 |
| ERRORLAST | 110 |

FIGURE 7

| SCALE FIELD | DEFINITION |
|---|---|
| FFT1_SCALE[6:5] | FFT INPUT GAIN, G1 ON GAIN DIAGRAM<br>00 - $2^0$ = 1, NO SHIFT<br>01 - $2^1$ = 2, LEFT SHIFT 1<br>10 - $2^2$ = 4, LEFT SHIFT 2<br>11 - $2^3$ = 8, LEFT SHIFT 3 |
| FFT1_SCALE[4:3] | FFT STAGE 1 FIRST RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[2:1] | FFT STAGE 1 SECOND RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[0] | FFT STAGE 1 RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[4] | FFT STAGE 2 FIRST RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[3:2] | FFT STAGE 2 RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT2_SCALE[1] | FFT STAGE 2 SECOND RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[0] | FFT STAGE 2 UNWIND STAGE OUTPUT DEVICE<br>0 - $2^0$ = 1, NO DIVIDE<br>1 - $2^{-1}$ = 0.5, DIVIDE BY 2 |

FIGURE 8

| 512 POINT IFFT | | 256 POINT IFFT | |
| --- | --- | --- | --- |
| IFFT_OP | DESCRIPTION | IFFT_OP | DESCRIPTION |
| 00000 | SUBFRAME 0, POINT 0, ... | 10000 | SUBFRAME 0, POINT 0, ... |
| 00001 | SUBFRAME 1, POINT 8, ... | 10001 | SUBFRAME 1, POINT 1, ... |
| 00010 | SUBFRAME 2, POINT 2, ... | 10010 | SUBFRAME 2, POINT 2, ... |
| 00011 | SUBFRAME 3, POINT 14, ... | 10011 | SUBFRAME 3, POINT 3, ... |
| 00100 | SUBFRAME 4, POINT 4, ... | 10100 | SUBFRAME 4, POINT 4, ... |
| 00101 | SUBFRAME 5, POINT 12, ... | 10101 | SUBFRAME 5, POINT 5, ... |
| 00110 | SUBFRAME 6, POINT 6, ... | 10110 | SUBFRAME 6, POINT 6, ... |
| 00111 | SUBFRAME 7, POINT 10, ... | 10111 | SUBFRAME 7, POINT 7, ... |
| 01000 | SUBFRAME 8, POINT 1, ... | 11000 | NOT DEFINED |
| 01001 | SUBFRAME 9, POINT 15, ... | 11001 | NOT DEFINED |
| 01010 | SUBFRAME 10, POINT 3, ... | 11010 | NOT DEFINED |
| 01011 | SUBFRAME 11, POINT 13, ... | 11011 | NOT DEFINED |
| 01100 | SUBFRAME 12, POINT 5, ... | 11100 | NOT DEFINED |
| 01101 | SUBFRAME 13, POINT 11, ... | 11101 | NOT DEFINED |
| 01110 | SUBFRAME 14, POINT 7, ... | 11110 | NOT DEFINED |
| 01111 | SUBFRAME 15, POINT 9, ... | 11111 | NOT DEFINED |

FIGURE 10

| SCALE FIELD | DEFINITION |
|---|---|
| FFT1_SCALE[5] | IFFT SATGE 1 WIND STAGE OUTPUT DIVIDE<br>0 - $2^0$ = 1, NO DIVIDE<br>1 - $2^{-1}$ = 0.5, DIVIDE BY 2 |
| FFT1_SCALE[4:3] | IFFT STAGE 1 FIRST RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[2:1] | IFFT STAGE 1 SECOND RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT1_SCALE[0] | IFFT STAGE 1 RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[7] | IFFT STAGE 2 FIRST RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[6:5] | IFFT STAGE 2 RADIX 4 STAGE OUTPUT DIVIDE<br>00 - $2^0$ = 1, NO DIVIDE<br>01 - $2^{-1}$ = 0.5, DIVIDE BY 2<br>11 - $2^{-2}$ = 0.25, DIVIDE BY 4 |
| FFT2_SCALE[4] | IFFT STAGE 2 SECOND RADIX 2 STAGE OUTPUT DIVIDE<br>0 - $2^0$ = 1, NO DIVIDE<br>1 - $2^{-1}$ = 0.5, DIVIDE BY 2 |
| FFT2_SCALE[3:0] | IFFT STAGE 2 OUTPUT SCALING - SEE TABLE BELOW |

FIGURE 11

COMBINED ECHO AND CROSSTALK CANCELLATION

CROSS-REFERENCE TO RELATED APPLICATIONS

This application is a continuation of U.S. patent application Ser. No. 12/012,908 filed Feb. 5, 2008 now abandoned, which claims priority from U.S. provisional patent application No. 60/900,180 filed Feb. 7, 2007, all of which are incorporated herein by reference.

FIELD OF THE INVENTION

The present invention relates generally to echo and crosstalk cancellation. More particularly, the present invention relates to frequency domain adaptive filters for echo and crosstalk cancellation.

BACKGROUND

Communications systems, including 10 GBase-T Ethernet systems, may make use of cancellation to improve the accuracy of communications. Noise to be cancelled may include echo and crosstalk.

SUMMARY

Embodiments of the invention provide combined echo and crosstalk cancellation. Frequency domain adaptive filters may be used to remove or reduce the effects of echo and crosstalk for a multi-channel and full-duplex communications system. Data from each transmit channel may be buffered and converted to the frequency domain. The frequency domain data may be multiplied by crosstalk coefficients to obtain a frequency domain correction signal for each channel. Adaptation of the crosstalk coefficients may be based on correlations between the error signals and the data from each of the transmit channels. A single frequency domain transform engine, such as a Fast Fourier Transform engine, may be employed for all calculations to save power and area.

BRIEF DESCRIPTION OF THE FIGURES

FIG. 7 is a table of FFT opcodes in accordance with an embodiment of the present invention.

FIG. 8 is a table of FFT scaling definitions in accordance with an embodiment of the present invention.

FIG. 10 is a table of FFT opcodes in accordance with an embodiment of the present invention.

FIG. 11 is a table of IFFT scaling definitions in accordance with an embodiment of the present invention.

DETAILED DESCRIPTION

Echo/NEXT Function

Figure 1:
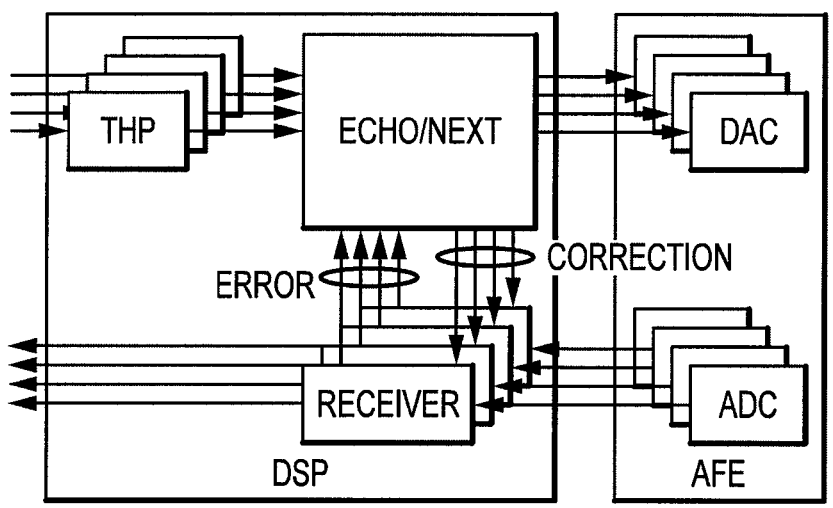
FIG. 1 is a schematic illustration of a DSP system including an Echo/NEXT block in accordance with an embodiment of the present invention.

The Echo/NEXT block fits in the DSP system as shown in FIG. 1. On the transmit data path, the Echo/NEXT block buffers data from the output of the THP, and after the Echo/NEXT correction has been calculated, it outputs the Tx data to the DACs in the AFE. On the receive data path, the Echo/NEXT block uses an error signal from the receiver to adapt the Echo/NEXT, and generates a correction signal that is subtracted from the receive signal.

Figure 2:
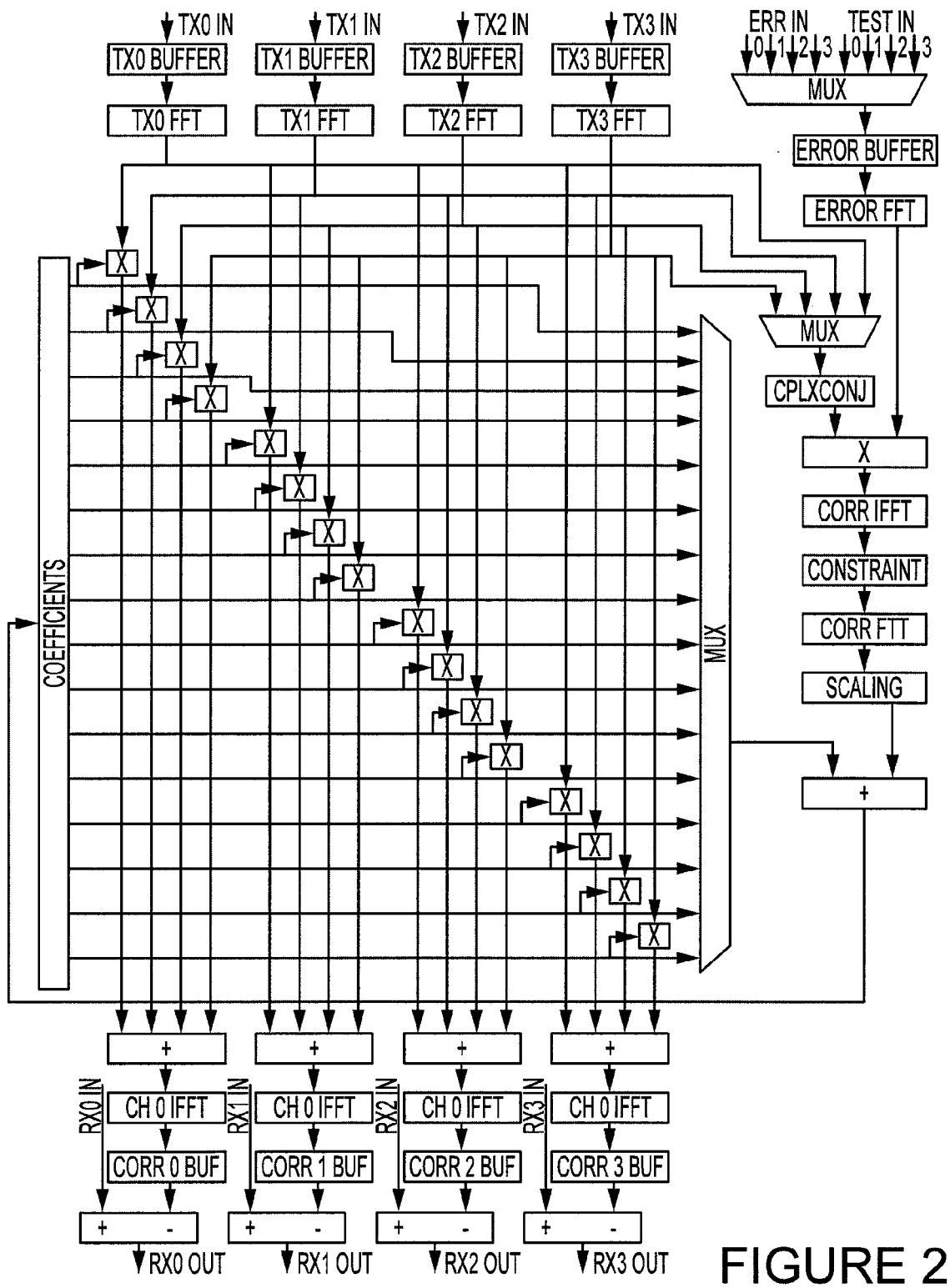
FIG. 2 is a schematic illustration of a frequency domain approach for correlating the error signal to the transmit data in accordance with an embodiment of the present invention.

The Echo/NEXT uses a frequency domain approach for correlating the error signal to the transmit data. The algorithm is illustrated in FIG. 2. Data from each transmit THP channel is buffered into a echonext frame of samples. Each echonext frame is 512 samples, and echonext frames are not correlated to data or LDPC frames. The data then converted to the frequency domain using an FFT. Data frequency domain transmit data is multiplied by the echo and crosstalk coefficients. The frequency domain correction for each channel is summed from the 4 aggressors. The frequency domain correction is then converted to time domain correction samples with an IFFT.

Adaptation is performed by correlating the error signal from each receiver with each of the 4 channels of transmit data. The error signal from one of the receivers is buffered, converted to the frequency domain with the FFT. Correlation in the frequency domain is performed by multiplying the FFT output of the error channel with the FFT output of one the transmit channels. This value is scaled and used to update the coefficients. Only some of the coefficients are updated on each frame of input data, but over the course of several frames, all the coefficients are updated.

Echo/NEXT Architecture

Figure 3:
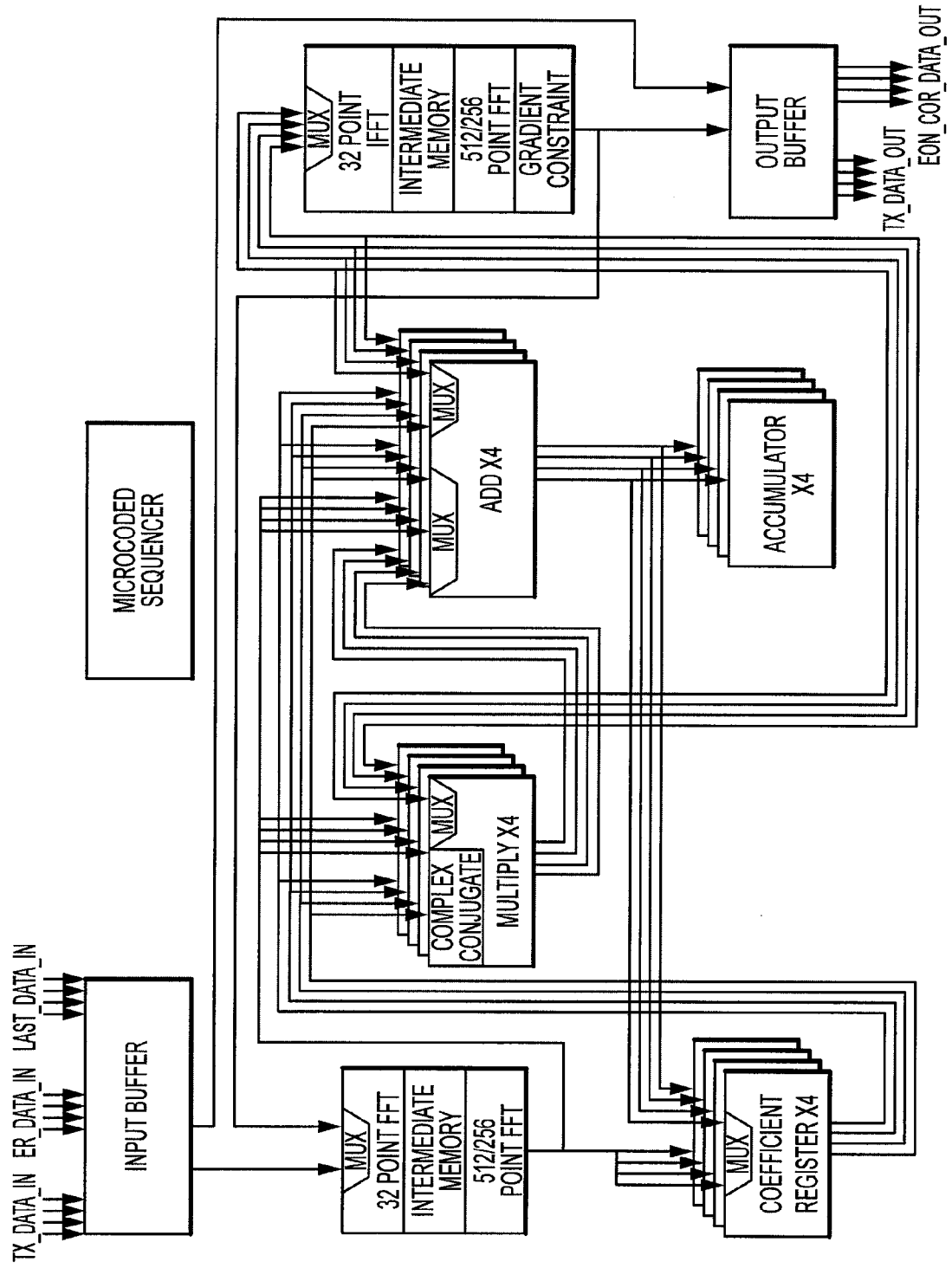
FIG. 3 is a schematic illustration of an Echo/NEXT canceller block in accordance with an embodiment of the present invention.
Figure 4:
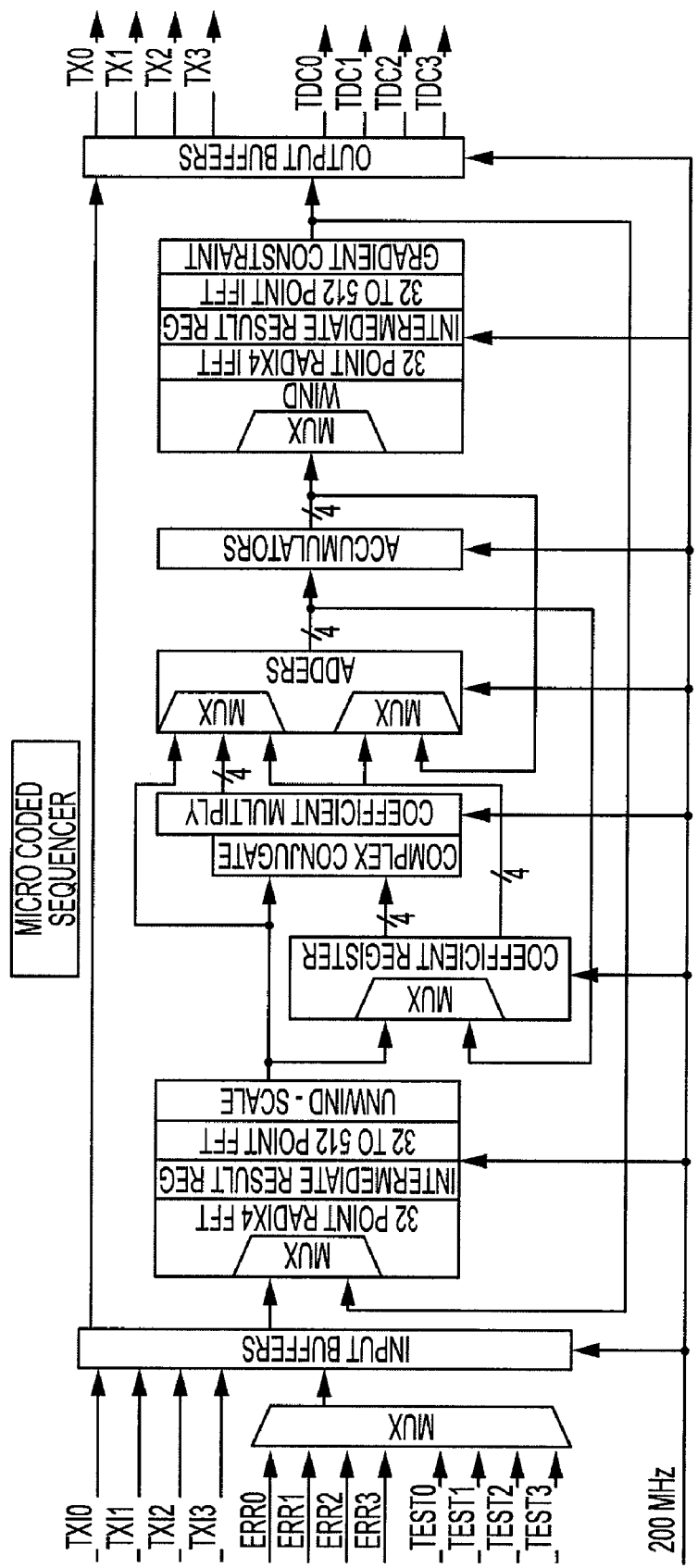
FIG. 4 is a schematic illustration of a data flow within an Echo/NEXT canceller block in accordance with an embodiment of the present invention.
Figure 5:
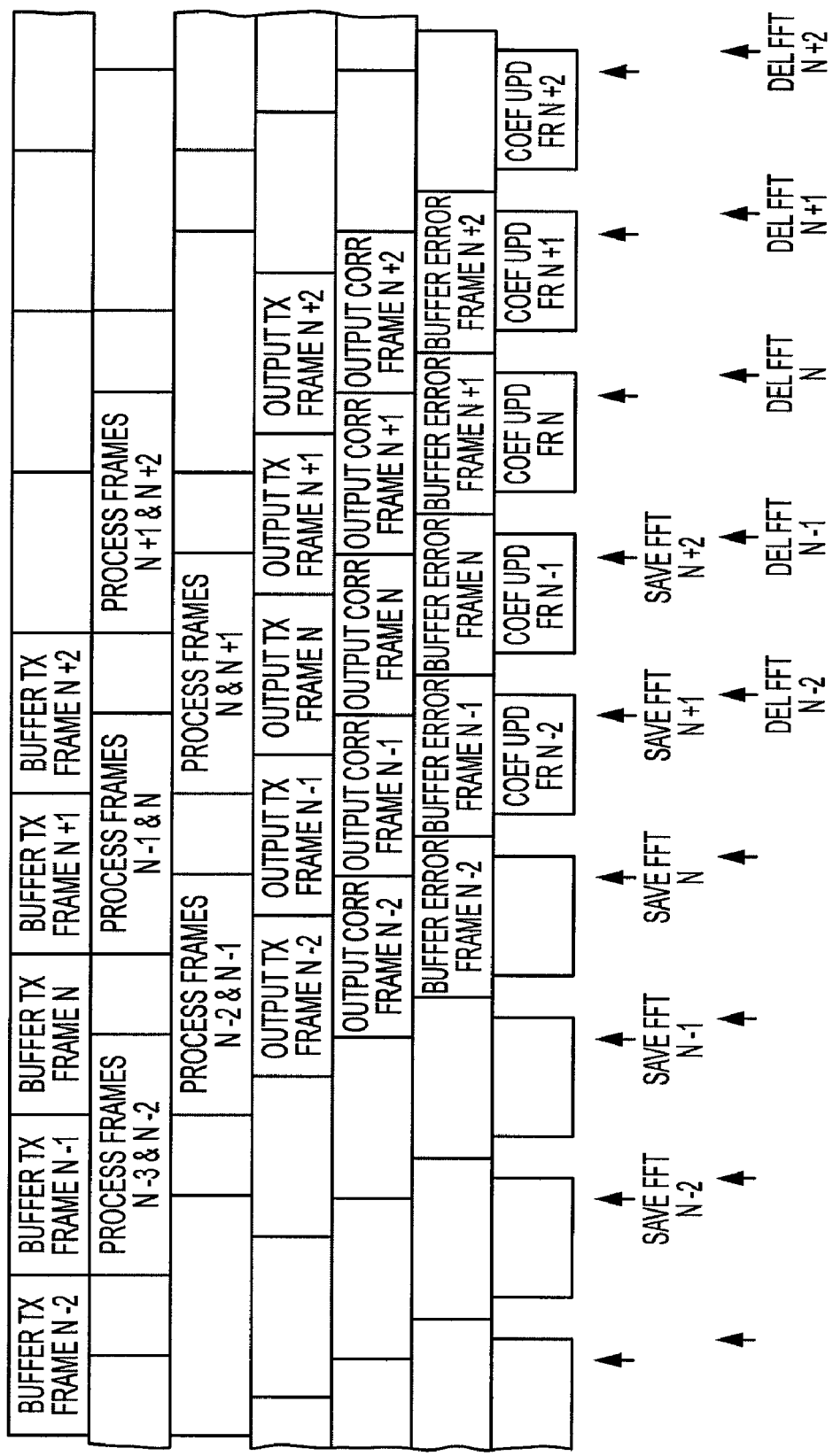
FIG. 5 is a schematic illustration of frame sampling in an Echo/NEXT canceller block in accordance with an embodiment of the present invention.
Figure 6:
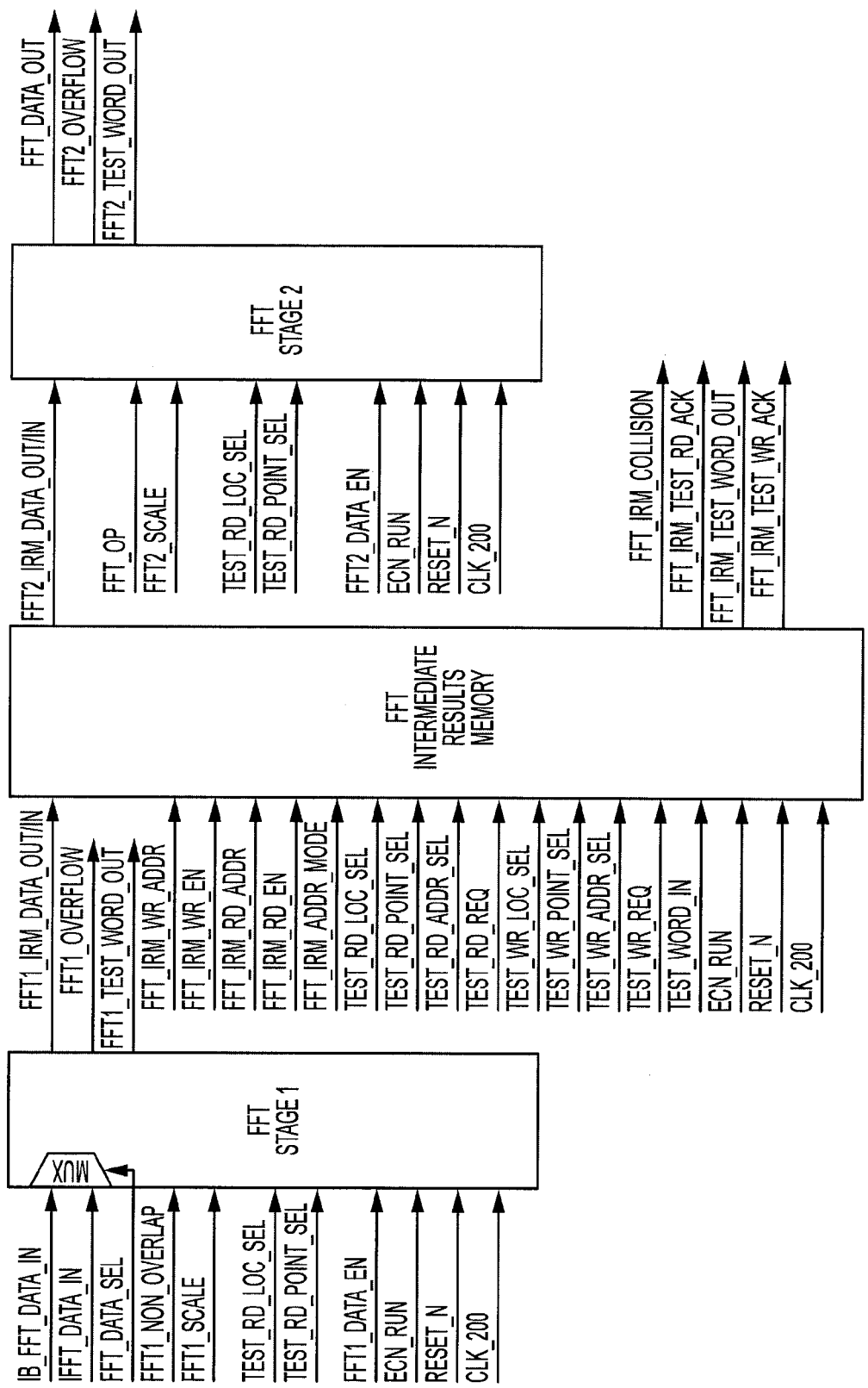
FIG. 6 is a schematic illustration of a 32 complex point FFT engine in accordance with an embodiment of the present invention.
Figure 9:
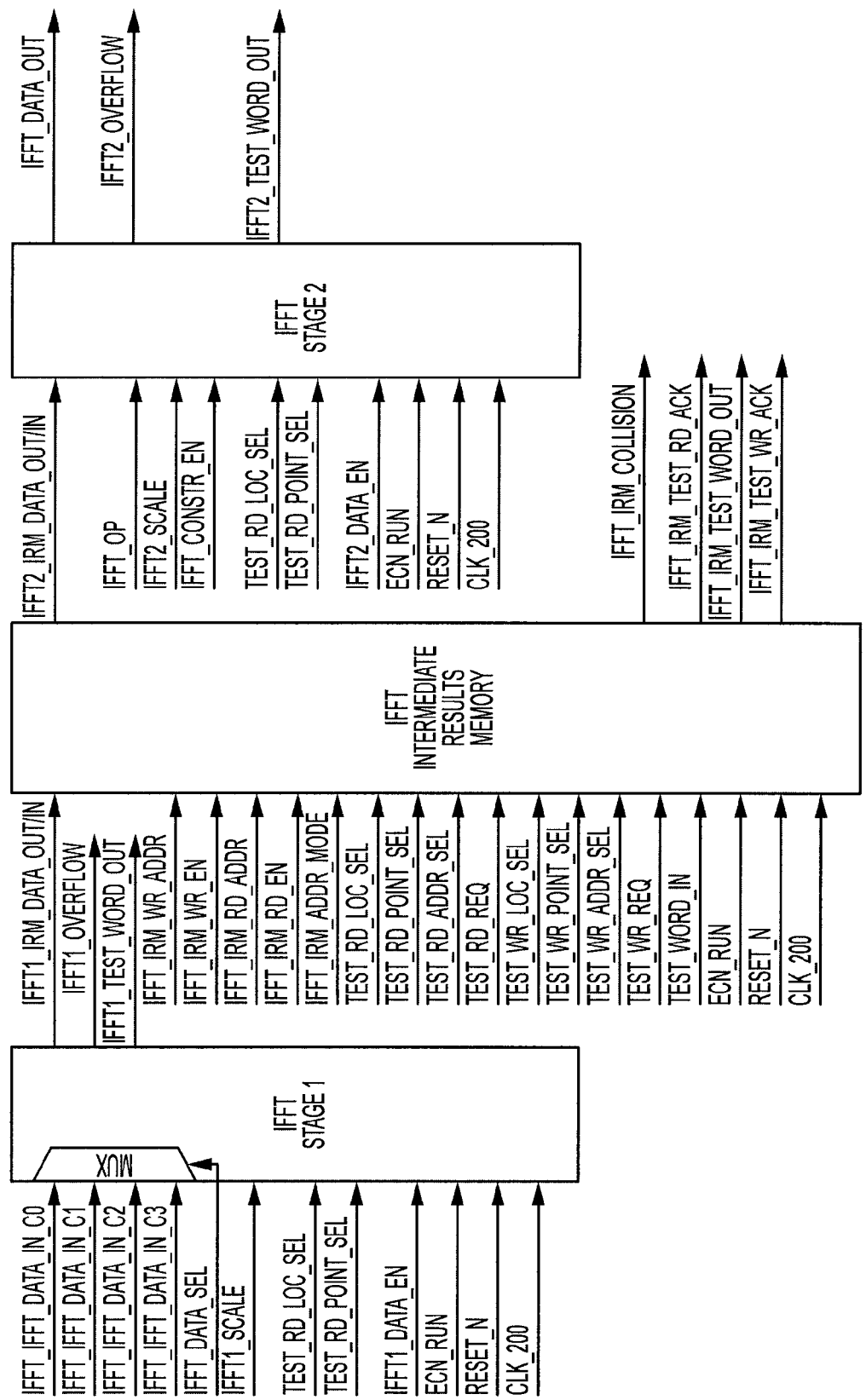
FIG. 9 is a schematic illustration of a 32 complex point FFT engine in accordance with an embodiment of the present invention.

The Echo/NEXT canceller block is a special purpose processor consisting of 4 computational units and 4 memory units (FIG. 3). Internal to the FFT and IFFT computation units, there are two additional memories for buffer and reordering intermediate data. These units are controlled by a microcoded sequencer. A more detailed view of the data flow is shown in FIG. 4. Frames of 512 or 256 samples are collected in the input buffer. Groups of two frames (1024 or 512 samples) are processed every 512 or 256 samples (FIG. 5). After the processing is complete, the transmit data is output to the AFE transmit DACs, and the correction data is output to the receiver summing node.

FFT

The FFT engine performs operations on groups of 32 complex points. The real only input data allows the mapping of 64 real points to 32 complex points. A 512 complex point FFT requires 16 passes through the FFT engine, and 8 passes are required for a 256 point FFT. The first stage of the FFT performs a 32 point complex FFT using fixed twiddle factors to reduce the size of the multipliers. The intermediate data from this stage is stored in the FFT Intermediate Result Memory. After all the input data has been processed by the first stage and stored in the intermediate memory, the second stage processes the data in groups of 32 points, but with the data reordered as required to perform the FFT. The second stage has look-up tables for the twiddle factors based on which point of the complete FFT are being processed. The fft_op signal specifies the operation (Table 7), which includes which pass of the FFT is being performed. The fft1_non_overlap signal specifies that an FFT is to be performed without overlap, so the first half of the data points should be forced to zero. This mode is used for computing the FFT of the error data. The fft1 scale and fft2 scale signals set the scaling used in the FFT (Table 8). Stage 2 includes a final stage unwinds the 512 complex frequency domain points. IFFT The IFFT engine processes the frequency domain cancellation signal that has be summed in the accumulator. Groups of 32 complex points are processed to generate a 512 or 256 point IFFT, similar to the FFT engine. To correctly map the data to a half length complex IFFT, a wind operation precedes the initial IFFT. The first stage IFFT uses constant twiddle factors, and the second stage has a look-up table for the twiddle factors based on which data point of the full IFFT are being processed. The IFFT intermediate memory reorders the data for the second stage of IFFT calculations. The ifft_op signal specifies the operation, including which passes of the IFFT is being performed. When the ifft_constr_en is active, the gradient constraint is applied to the output of the IFFT.

Details of various embodiments of the present invention are also disclosed in the following appendices:
Appendix I: a 118-page document by the inventors.
Appendix II: a 2-page document by the inventors.
Appendix III: a 1-page document by the inventors As one of ordinary skill in the art will appreciate, various changes, substitutions, and alterations could be made or otherwise implemented without departing from the principles of the present invention. Accordingly, the examples and drawings disclosed herein including the appendices are for purposes of illustrating the preferred embodiments of the present invention and are not to be construed as limiting the invention.

We claim:

1. A method for correcting data signals, the method comprising:
   receiving a first signal in a time domain, wherein the first signal is configured for transmission over a first channel;
   calculating a first representation of the first signal in a frequency domain using a transform unit;
   receiving a second signal in the time domain, wherein the second signal is configured for transmission over a second channel;
   calculating a second representation of the second signal in the frequency domain using the transform unit, wherein at least a portion of said calculating a second representation occurs after said calculating a first representation of the first signal;
   multiplying the first representation of the first signal by a plurality of coefficients to generate a correction signal in the frequency domain;
   generating a third representation of the correction signal in the time domain using an inverse transform unit; and
   combining the third representation of the correction signal with a third signal received over the first channel.

2. The method of claim 1, wherein at least one of the plurality of coefficients is based, at least in part, on crosstalk from the second channel.

3. The method of claim 1, further comprising:
   buffering the second signal during at least a portion of said calculating a first representation of the first signal.

4. The method of claim 1, wherein the transform unit is configured to perform a Fourier transform having a first number of points, wherein said calculating a first representation of the first signal comprises interleaving a plurality of portions of the first signal into the transform unit to generate the first representation having a second number of points, and wherein the second number is greater than the first number.

5. The method of claim 1, wherein the inverse transform unit is configured to perform an inverse Fourier transform having a first number of points, wherein said generating a third representation of the correction signal comprises interleaving a plurality of portions of the correction signal into the inverse transform unit to generate the third representation having a second number of points, and wherein the second number is greater than the first number.

6. The method of claim 1, further comprising:
   updating each of the plurality of coefficients during a respective time period.

7. The method of claim 6, wherein said updating each of the plurality of coefficients comprises combining an error signal with the first representation of the first signal in the frequency domain.

8. The method of claim 1, wherein the plurality of coefficients comprises a first plurality of coefficients, and wherein the correction signal comprises a first correction signal, the method further comprising:
   multiplying the second representation of the second signal by another plurality of coefficients to generate a second correction signal in the frequency domain;
   generating a fourth representation of the second correction signal in the time domain using the inverse transform unit, wherein at least a portion of said generating a fourth representation occurs after said generating a third representation of the first correction signal; and
   combining the fourth representation of the second correction signal with a fourth signal received over the second channel.

9. An interference canceller comprising:
   a multiplexer configured to receive a plurality of first signals in a time domain, wherein each of the plurality of first signals are for transmission over a respective channel, and wherein the multiplexer is further configured to select each one of the plurality of first signals at a respective time;
   a transform unit coupled to the multiplexer and configured to receive each one of the plurality of first signals at the respective time, wherein the transform unit is further configured to generate a respective representation in a frequency domain for each of the plurality of first signals, and wherein the transform unit is further configured to generate the respective representation of at least one of the plurality of first signals after generating the respective representation of another of the plurality of first signals;
   a multiplication unit coupled to the transform unit and configured to receive at least one of the respective representations and multiply the respective representation by a plurality of coefficients to generate a correction signal in the frequency domain;
   an inverse transform unit coupled to the multiplication unit and configured to receive the correction signal in the frequency domain and generate a representation of the correction signal in the time domain; and
   a combiner configured to combine the representation of the correction signal in the time domain with a second signal received over at least one of the channels.

10. The interference canceller of claim 9, further comprising:

at least one coefficient register coupled to the multiplication unit and configured to store at least one of the plurality of coefficients.

11. The interference canceller of claim 9, further comprising:
a coefficient updater coupled to the at least one coefficient register, wherein the coefficient updater is configured to receive an error signal and update the at least one coefficient based, at least in part, on the error signal.

12. The interference canceller of claim 11, wherein the coefficient register is further configured to store the plurality of coefficients, and wherein the coefficient updater is further configured to update each of the plurality of coefficients during a respective time period.

13. The interference canceller of claim 9, wherein at least one of the plurality of coefficients is based, at least in part, on echo in at least one of the channels.

14. The interference canceller of claim 9, wherein at least one of the plurality of coefficients is based, at least in part, on crosstalk between two of the channels.

15. The interference canceller of claim 9, wherein the transform unit is further configured to perform a Fourier transform having a first number of points, wherein the transform unit is further configured to interleave a plurality of portions of at least one of the plurality of first signals to generate the respective representation having a second number of points, and wherein the second number is greater than the first number.

16. The interference canceller of claim 9, wherein the inverse transform unit is further configured to perform an inverse Fourier transform having a first number of points, wherein the inverse transform unit is further configured to interleave a plurality of portions of the correction signal to generate the representation of the correction signal in the frequency domain having a second number of points, and wherein the second number is greater than the first number.

17. The interference canceller of claim 9, further comprising:
a sequencer coupled to the multiplexer and configured to provide a control signal to the multiplexer indicative of a selected one of the plurality of first signals.

18. The interference canceller of claim 9, further comprising:
at least one buffer configured to buffer at least one of the plurality of first signals during at least a portion of time the transform unit is processing another of the plurality of first signals.

19. A system comprising:
an interference canceller configured to receive a plurality of first signals in a time domain, wherein each of the plurality of first signals are for transmission over a respective channel, wherein the interference canceller includes:
a multiplexer configured to receive the plurality of first signals in the time domain, wherein the multiplexer is further configured to select each one of the plurality of first signals at a respective time;
a transform unit coupled to the multiplexer and configured to receive each one of the plurality of first signals at the respective time, wherein the transform unit is further configured to generate a respective representation in a frequency domain of each of the plurality of first signals, and wherein the transform unit is further configured to generate the respective representation of at least one of the plurality of first signals after generating the respective representation of another of the plurality of first signals;
a multiplication unit coupled to the transform unit and configured to receive at least one of the respective representations and multiply the respective representation by a plurality of coefficients to generate a correction signal in the frequency domain; and
an inverse transform unit coupled to the multiplication unit and configured to receive the correction signal in the frequency domain and generate a representation of the correction signal in the time domain;
at least one analog-to-digital converter configured to receive a plurality of second signals, wherein each of the plurality of second signals are received over one of the respective channels, and wherein the at least one analog-to-digital converter is further configured to convert the plurality of second signals from an analog representation into a digital representation; and
at least one receiver coupled to the at least one analog-to-digital converter and the interference canceller and configured to receive the digital representation of at least one of the plurality of second signals and the representation of the correction signal in the time domain, wherein the at least one receiver is further configured to combine the digital representation of the at least one of the plurality of second signals with the correction signal in the time domain.

20. The system of claim 19, wherein the transform unit is further configured to perform a Fourier transform having a first number of points, wherein the transform unit is further configured to interleave a plurality of portions of at least one of the plurality of first signals to generate the respective representation having a second number of points, and wherein the second number is greater than the first number.

21. The system of claim 20, wherein the inverse transform unit is further configured to perform an inverse Fourier transform having a first number of points, wherein the inverse transform unit is further configured to interleave a plurality of portions of the correction signal to generate the representation of the correction signal in the frequency domain having a second number of points, and wherein the second number is greater than the first number.

22. The system of claim 19, wherein the receiver is further configured to generate an error signal based, at least in part, on the digital representation of at least one of the plurality of second signals.

23. The system of claim 22, wherein the interference canceller is further configured to receive the error signal and update at least one of the plurality of coefficients based, at least in part, on the error signal.

24. The system of claim 19, wherein at least one of the plurality of coefficients is based, at least in part, on echo in at least one of the channels.

25. The system of claim 19, wherein at least one of the plurality of coefficients is based, at least in part, on crosstalk between two of the channels.

26. The method of claim 1, wherein at least one of the plurality of coefficients is based, at least in part, on echo in the first channel.

* * * * *